United States Patent [19]
Oh et al.

[11] Patent Number: 5,769,948
[45] Date of Patent: Jun. 23, 1998

[54] SEMICONDUCTOR FABRICATING APPARATUS HAVING VACUUM CONTROL AND DETECTION SYSTEM

[75] Inventors: Hyun-Don Oh; Heung-Bok Lee, both of Youngin-goon, Rep. of Korea

[73] Assignee: Samaung Electronics Co., Ltd., Suwon, Rep. of Korea

[21] Appl. No.: 872,183

[22] Filed: Jun. 10, 1997

[30]    Foreign Application Priority Data

Jun. 11, 1996 [KR]    Rep. of Korea ............... 1996-20736

[51] Int. Cl.[6] .......................... B05C 13/00; B05C 11/00
[52] U.S. Cl. .......................................... 118/500; 118/703
[58] Field of Search ................................ 118/500, 503, 118/703, 668, 676, 52, 319, 320; 269/21, 55; 361/194, 195, 196; 134/902; 414/935

[56]    References Cited

U.S. PATENT DOCUMENTS 3,645,581    2/1972    Lasch, Jr. et al. ..................... 118/52

*Primary Examiner*—Donald E. Czaja
*Assistant Examiner*—Calvin Padgett
*Attorney, Agent, or Firm*—Jones & Volentine, L.L.P.

[57]    ABSTRACT

A vacuum control and detection system for a semiconductor fabricating apparatus includes a vacuum line connected to a plate for holding a semiconductor wafer to be processed. An electromagnetic valve is connected to the vacuum line for selectively opening and closing the vacuum line. A control unit receives a wafer sensing signal from the plate, and supplies an actuating voltage to the electromagnetic valve to open the vacuum line and securely hold the wafer to the plate via a vacuum force. A time delay device also receives the actuating voltage from the control unit and outputs a wafer holding signal to the control unit after a 2–3 second time delay. After wafer processing operations are completed, the control unit deactivates the actuating voltage supplied to the electromagnetic valve and the time delay device to close the vacuum line and release the vacuum force on the wafer.

6 Claims, 1 Drawing Sheet

SEMICONDUCTOR FABRICATING APPARATUS HAVING VACUUM CONTROL AND DETECTION SYSTEM

BACKGROUND OF THE INVENTION

1. Field of the Invention

The present invention relates to semiconductor fabricating apparatus, and more particularly, to a vacuum control and detection system for use in a semiconductor fabricating apparatus in which a time delay device is integrated with a vacuum line connected to a plate holding a semiconductor wafer to be processed.

2. Description of the Related Art

Many pieces of equipment and apparatus are used to perform a number of processes for fabricating a semiconductor device. Once such process is lithography, during which an apparatus coats a photoresist material onto semiconductor wafers followed by a photoresist baking sequence.

In a conventional coating and baking apparatus, as shown in FIG. 1, a control unit 10, an electromagnetic valve 14, a vacuum sensor 16, and a plate 20 are used to receive a semiconductor wafer W, secure it during processing, and release the wafer W after processing.

More specifically, the electromagnetic valve 14 opens or closes the main vacuum line 18 connected to the plate 20. The vacuum sensor 16 is a switch that is mechanically coupled to the auxiliary vacuum line 18' at the outlet port of the electromagnetic valve 14 for sensing the vacuum state of the plate 20. The control unit 10 receives a switching signal from the vacuum sensor 16 and a wafer sensing signal WS from a sensor (not shown) provided in the plate 20. The control unit 10 also produces an actuating signal that is supplied to the electromagnetic valve 14. D1 denotes a reverse current protecting diode connected in parallel with an actuator coil 14' of the electromagnetic valve 14.

In operation, when a wafer W is placed onto the plate 20, a wafer sensing or detecting signal WS is supplied to the control unit 10. The control unit 10 then produces the actuating signal, which supplies the actuating voltage B+ to the actuator coil 14'. In response to the actuator signal, the electromagnetic valve 14 opens the main vacuum line 18 to hold the wafer W on the plate 20 by vacuum force. A diaphragm 19 provided at the auxiliary vacuum line 18' moves inwardly due to the vacuum force, thereby activating the switch in the vacuum sensor 16. A wafer holding signal is thus produced and supplied to the control unit 10. The control unit 10 then performs the necessary control operations for the coating and baking processes while the wafers W are firmly held on the plate 20.

After a preset wafer processing time has elapsed, the control unit 10 produces a deactivating signal in order to close the electromagnetic valve 14 and shut off the main vacuum line 18. After releasing the vacuum force in the plate 20, the vacuum sensor 16 switches off and supplies a wafer releasing signal supplied to the control unit 10. After the wafer is released, the control unit 10 repeats the above operations for the next wafer.

A disadvantage of the above apparatus, in which the vacuum sensor 16 is operated by the diaphragm 19 of the auxiliary vacuum line 18', is that the sensitivity of the vacuum sensor 16 switch tends to vary due to changes in the vacuum control condition and leakage of the vacuum. Also, vacuum sensor 16 switch errors occur due to degradation of the diaphragm 19. Accordingly, the vacuum sensor 16 switch must be replaced periodically in order to ensure the reliability of the semiconductor fabricating apparatus, thereby increasing maintenance costs and decreasing productivity.

SUMMARY OF THE INVENTION

The present invention is directed to a vacuum control and detection system for carrying out reliable and cost-saving semiconductor wafer processes, which substantially overcomes one or more of the problems due to the limitations and disadvantages of the related art.

In general, the present invention incorporates a time delay device that provides a wafer holding signal to the control unit after a preset time following the receipt of an actuating voltage from the control unit. In addition, the time delay device also immediately generates a wafer releasing signal when the actuating voltage is deactivated. Accordingly, the conventional vacuum switch, which is connected to the vacuum line, can be eliminated.

To achieve these and other advantages and in accordance with the purpose of the invention, as embodied and broadly described, the invention provides a semiconductor fabricating apparatus having a vacuum line connected to a plate for holding a semiconductor wafer to be processed, a vacuum control and detection system comprising: an electromagnetic valve connected to the vacuum line for selectively opening and closing the vacuum line; a control unit having a first input terminal for receiving a wafer sensing signal from the plate, and an output terminal for supplying an actuating voltage, responsive to the wafer sensing signal, to the electromagnetic valve to open the vacuum line and securely hold the wafer to the plate via a vacuum force; and a time delay device having an input terminal for receiving the actuating voltage from the control unit, and an output terminal for outputting a wafer holding signal to a second input terminal of the control unit after a first predetermined time period has elapsed from receiving the actuating voltage.

Preferably, the first predetermined time period is two to three seconds. Also, the control unit deactivates the actuating voltage supplied to the electromagnetic valve and the time delay device after a second predetermined period of time, to thereby close the vacuum line and release the vacuum force on the wafer. The time delay device immediately outputs a wafer release signal to the control unit after the actuating voltage is deactivated.

It is to be understood that both the foregoing general description and the following detailed description are exemplary and explanatory and are intended to provide further explanation of the invention as claimed.

BRIEF DESCRIPTION OF THE DRAWINGS

The foregoing and other objects, aspects and advantages will be better understood from the following detailed description of a preferred embodiment of the invention with reference to the drawing, in which.

DETAILED DESCRIPTION OF PREFERRED EMBODIMENT

An exemplary embodiment of the vacuum control and detection system of the present invention for a semiconductor fabricating apparatus will now be described with reference to FIG. 2.

Figure 1:
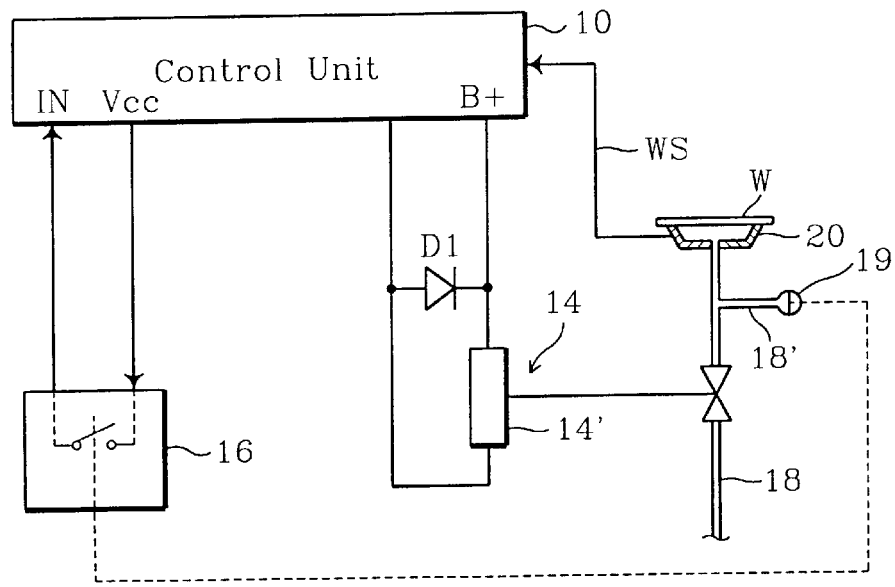
FIG. 1 is a schematic diagram illustrating a vacuum control and detection system for use in a conventional semiconductor fabricating apparatus.
Figure 2:
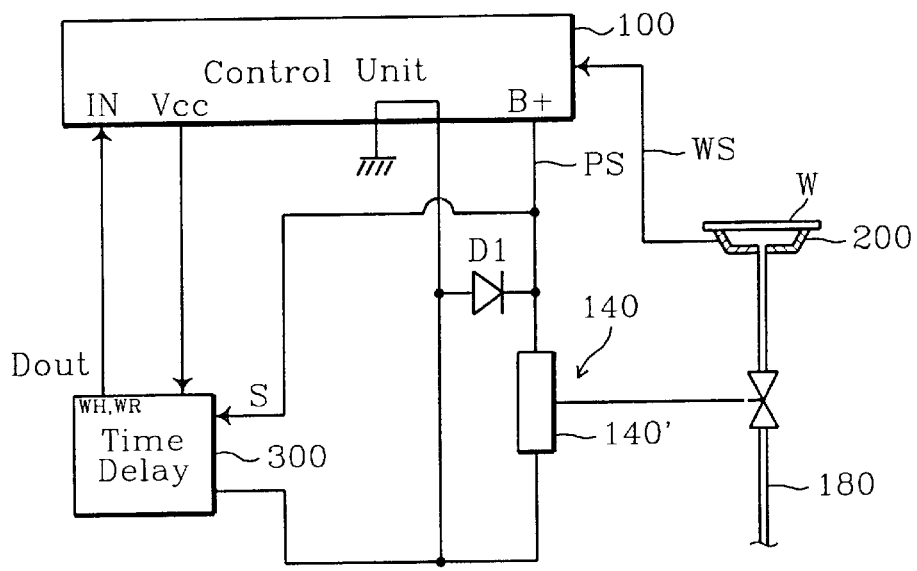
FIG. 2 is a schematic diagram illustrating a vacuum control system for use in a semiconductor fabricating apparatus in accordance with the present invention.

Referring to FIG. 2, the apparatus comprises a control unit 100, an electromagnetic valve 140, a wafer receiving plate 200, and a time delay device 300. The electromagnetic valve 140 opens or closes the vacuum line 180 connected to the plate 200 for receiving a semiconductor wafer W, securing it during processing, and releasing the wafer W after processing.

The time delay device 300 may be, for example, a time relay having an input terminal S for receiving a start signal, and an output terminal $D_{OUT}$ for supplying a wafer status signal to a signal input IN terminal of the control unit 100. The signal input S is connected to the power supply line PS of the electromagnetic valve 140. The time delay device 300 is configured to produce a delayed signal representing the "hold" state WH of the wafer W after a predetermined amount of time elapses, as measured from when the electromagnetic valve 140 starts to operate. The "hold" state refers to when the wafer W is held on the plate 200 by a vacuum force supplied through the vacuum line 180. In this embodiment, the delay time of the time delay device 300 is preferably set to two or three seconds.

The control unit 100 receives a wafer sensing signal WS from a sensor (not shown) provided in the plate 200. The control unit 100 also produces an actuating signal for supplying the actuating voltage B+ to the electromagnetic valve 140 through the power supply line PS. D1 denotes a reverse current protecting diode connected in parallel with an actuator coil 140' of the electromagnetic valve 140, that protects against the reverse current of the actuator coil 140' when the supply voltage is interrupted or deactivated.

With the above arrangement, the operation of the vacuum control and detection system will now be described. When a wafer W is placed onto the plate 200, a wafer sensing signal WS is supplied to the control unit 100. Then the control unit 100 produces an actuating signal which supplies the actuating voltage B+ to the actuator coil 140' of the electromagnetic valve 140. The actuating voltage B+ is set to 24 volts DC. The electromagnetic valve 140 opens the main vacuum line 180 to hold the wafer W on the plate 200 by vacuum force.

The same actuating voltage B+ is supplied to the input terminal S of the time delay device 300. As mentioned previously, the time delay device 300 is preferably comprised of a time relay started by the actuating voltage B+, with the delay time being set to 2 to 3 seconds. After the 2 to 3 second delay, the time delay device 300 produces a wafer hold WH signal at its output terminal $D_{OUT}$ representing that the wafer is held on the plate 200 by a vacuum force. This wafer holding signal WH is supplied to an input IN of the control unit 100. The control unit 100 then performs the necessary control operations for the photoresist coating and baking processes while wafers W are firmly held on the plate 200.

After a preset time to complete the photoresist processes, as set in the control unit 100, has elapsed, the control unit 100 produces a signal which deactivates the actuating voltage B+. The actuator coil 140' is de-energized and the electromagnetic valve 140 moves to its closed position, shutting off the vacuum through the main vacuum line 180. With the main vacuum line 180 closed, the vacuum force applied to the plate 200 is released.

The actuating voltage B+ supplied to the input terminal S of the time delay device 300 is also deactivated. The time delay device 300 then immediately produces a wafer release signal WR at its output terminal $D_{OUT}$ representing the vacuum or wafer releasing state of the wafer on the plate 200, with the vacuum releasing signal WR being supplied to the control unit 100. After the wafer is released, the control unit 100 repeats the above operations for the next wafer.

As described above, in the present invention, the time delay device 300 provides a wafer holding signal to the control unit after a preset time following the application of the vacuum to the wafer holding plate, in response to the actuating voltage B+ supplied to the actuator coil 140 '. In addition, the wafer releasing signal is produced in direct response to the absence of the actuating voltage B+. Accordingly, the conventional vacuum switch, which is connected to the vacuum line, can be eliminated.

Several advantages flow from the elimination of the vacuum switch. Errors or variances due to changes in the vacuum control condition, vacuum leakage, and degradation of a diaphragm are eliminated. Moreover, the need to periodically replace the vacuum switch is eliminated, thereby increasing productivity and reducing manufacturing costs.

While the invention has been described in terms of the embodiments described above, those skilled in the art will recognize that the invention can be practiced with modification within the spirit and scope of the appended claims and their equivalents.

What is claimed is:

1. In a semiconductor fabricating apparatus having a vacuum line connected to a plate for holding a semiconductor wafer to be processed, a vacuum control and detection system comprising:

an electromagnetic valve connected to said vacuum line for selectively opening and closing said vacuum line;

a control unit having a first input terminal for receiving a wafer sensing signal from the plate, and an output terminal for supplying an actuating voltage, responsive to the wafer sensing signal, to the electromagnetic valve to open the vacuum line and securely hold the wafer to the plate via a vacuum force; and a time delay device having an input terminal for receiving the actuating voltage from the control unit, and an output terminal for outputting a wafer holding signal to a second input terminal of the control unit after a first predetermined time period has elapsed from receiving the actuating voltage.

2. The apparatus as claimed in claim 1, wherein the first predetermined time period is two to three seconds.

3. The apparatus as claimed in claim 2, said control unit further comprising means for deactivating the actuating voltage supplied to the electromagnetic valve and the time delay device after a second predetermined period of time, to thereby close the vacuum line and release the vacuum force on the wafer.

4. The apparatus as claimed in claim 3, wherein the second predetermined period of time corresponds to a time required for photoresist coating and baking operations to be performed on the wafer.

5. The apparatus as claimed in claim 4, wherein said output terminal of said time delay device immediately outputs a wafer release signal to the second input terminal of the control unit after said actuating voltage is deactivated.

6. The apparatus as claimed in claim 2, wherein said time delay device comprises a time relay having an input for receiving the actuating signal and an output for outputting a time delayed signal.

* * * * *